United States Patent [19]

Matzuk

[11] Patent Number: 4,691,571

[45] Date of Patent: Sep. 8, 1987

[54] TISSUE SIGNATURE TRACKING TRANSCEIVER HAVING UPCONVERTED IF AMPLIFICATION

[75] Inventor: Terrance Matzuk, Verona, Pa.

[73] Assignee: Dymax Corporation, Pittsburgh, Pa.

[21] Appl. No.: 902,140

[22] Filed: Sep. 3, 1986

Related U.S. Application Data

[63] Continuation of Ser. No. 707,584, Mar. 4, 1985, abandoned.

[51] Int. Cl.⁴ ............................................. G01N 29/04
[52] U.S. Cl. ......................................... 73/632; 73/900; 128/660
[58] Field of Search ............... 73/632, 900, 602, 629; 128/660

[56] References Cited

U.S. PATENT DOCUMENTS

| | | | |
|---|---|---|---|
| 4,016,750 | 4/1977 | Green | 128/660 |
| 4,132,952 | 1/1979 | Hongu et al. | 325/459 |
| 4,197,750 | 4/1980 | Hassler | 73/629 |
| 4,352,210 | 9/1982 | Puckette | 455/317 |
| 4,378,596 | 3/1983 | Clark | 73/900 |
| 4,442,715 | 4/1984 | Brisken et al. | 73/626 |

OTHER PUBLICATIONS

Wescon, "Mixers for High Performance Radio", Wescon Conference Record, vol. 25, pp. 1–4, 1981.
"Überlagerungsempfänger–Wahl der Zwischenfrequenz", Funkschau, vol. 48, No. 25, 1109–1110, Dec. 1976.
IBM Tech. Disclosure Bulletin, "Voltage Variable Bandpass Filter", F. E. Noel, vol. 18, No. 5, Oct. 1975.
Wescon Tech. Papers, "Solutions to Problems of Low-Noise Amplification at Microwave Frequencies," Convention, Aug. 25–28, 1970, Session 9.

*Primary Examiner*—Anthony V. Ciarlante
*Attorney, Agent, or Firm*—Weingarten, Schurgin, Gagnebin & Hayes

[57] ABSTRACT

An improved ultrasound transceiver providing enhanced imaging by selective filtering of the received signal to provide a variable frequency, constant bandwidth filtering of the received echo signals. The transceiver provides a constant bandwidth filtering by upconverting the received signals to a higher incremented frequency, which is thereafter detected. The resulting signals are then displayed wherein the number of false multiple images is reduced, and the signal quality from the deeper tissue discontinuities is enhanced. The resulting signal is thereafter post-processed to provide enhanced information which is used to display structural features.

14 Claims, 5 Drawing Figures

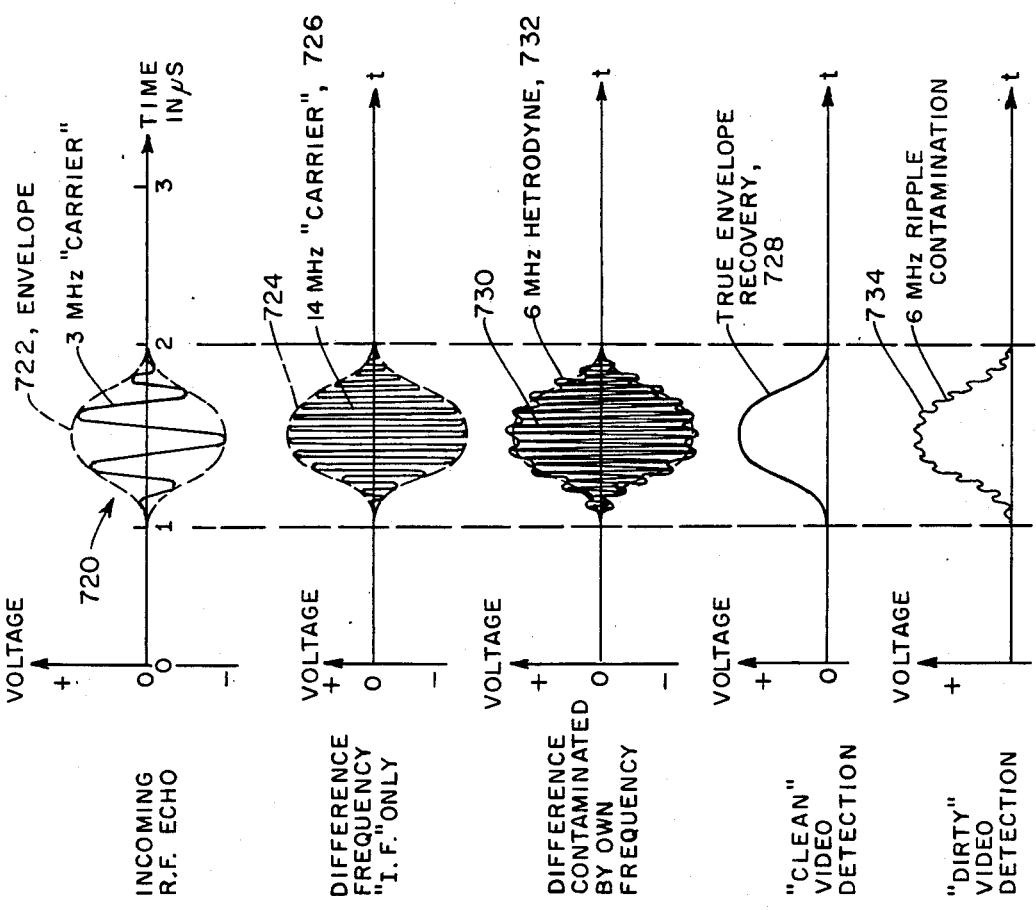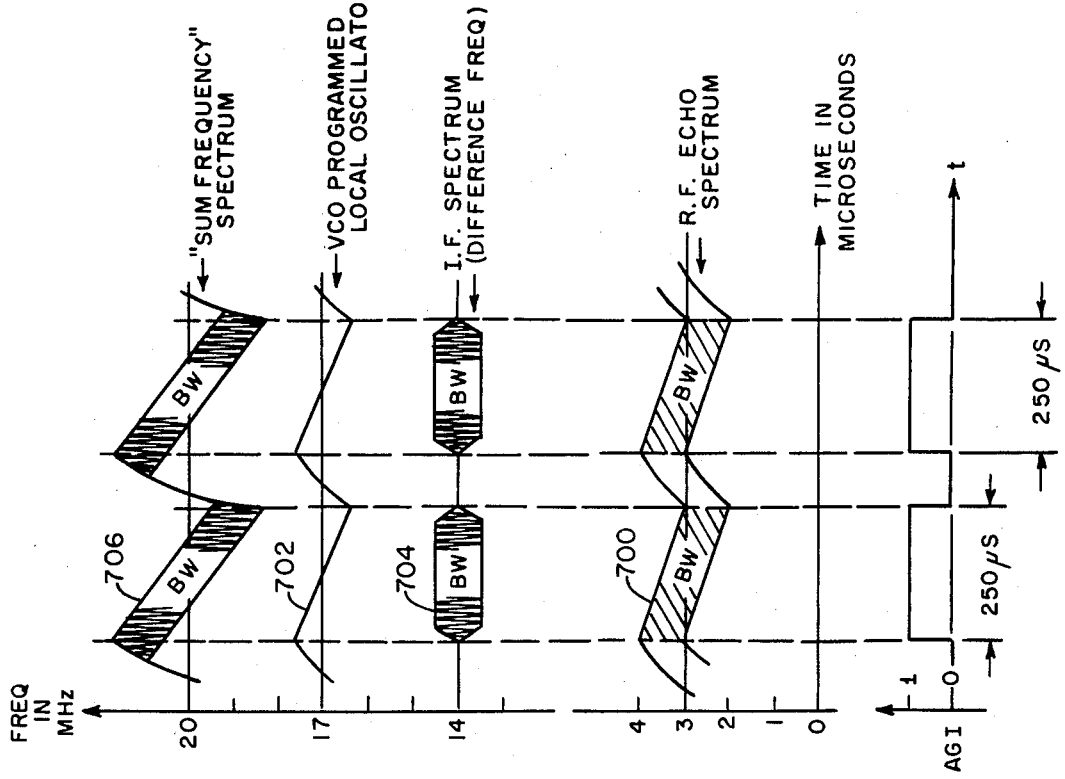

TISSUE SIGNATURE TRACKING TRANSCEIVER HAVING UPCONVERTED IF AMPLIFICATION

This is a continuation of application Ser. No. 707,584, filed Mar. 4, 1985, now abandoned.

FIELD OF THE INVENTION

The present invention relates to medical ultrasound images, and in particular, to methods and apparatus for processing ultrasound signals in real-time.

BACKGROUND OF THE INVENTION

For years, clinical ultrasound systems have incorporated either pulsed or continuous waves (CW) ultrasound techniques for imaging of tissue structure and flow of blood therethrough. Since the tissue investigated is a dispersive medium, signals transmitted into and thereafter reflected from tissue discontinuities suffers significiant attenuation. That is, the greater the path taken by the acoustic signal within the subject, the greater the signal attenuated and otherwise changed. Previous systems have included compensation techniques such as time-controlled gain to provide correction for the anticipated attenuation by the signal in the subject tissue. Similarly, other correction techniques have been applied with varying degrees of success. Regardless of the correction techniques used thus far, certain problems remain. Typical of these problems are the multiple reflections incurred between the surface of the specimen to be investigated, and the surface of the transducer thereof within the ultrasonic probe. Moreover, for the deeper signal penetration levels, the signal becomes excessively attenuated, often obscuring critical imaging information, and unfocussed.

One approach taken by the applicant in previously filed application Ser. No. 616,581, entitled "Tissue Signature Tracking Tranceiver," incorporates the phenomenon of tissue signature analysis, wherein the transmitted pulse returns in a frequency-skewed form as a result of the transition through the tissue medium. However effective the system described therein may be, further improvements for technical and economic reasons are desired.

While the method described in the previous disclosure provides substantial improvement in overall image quality and in overall image uniformity, the following limitations exist arising from problems of implementation and economics:

(1) When filter tracking is implemented, either filter inductance or capacitance must be modulated (e.g. saturable reactors or varactor diodes) to a very great extent because the required modulation of component values is the square of the frequency range. The resulting impedance variation is significant during the frequency tracking slew. If the percentage of frequency modulation could be reduced, the modulations of circuit component parameters could be also reduced.

(2) The low-pass and high-pass cutoff frequencies must track to maintain a constant bandwidth.

(3) The detector, regardless of its sophistication, must work with the baseband RF signal. Since the video frequency (envelope) information is so close to the lowest carrier frequency at the bottom of the echo-train, there is the practical problem of designing a broadband detector that has impressive risetime performance but still suppresses carrier ripples (e.g., second harmonic). A detector capable of meeting the fast rise-time vs. low ripple criterion must contain high-order low-pass filters that represent some cost. If greater separation between the video (envelope) information and the carrier frequency were possible, one could obtain the required detector performance with a simple first-order low-pass filter after demodulation.

(4) In the design of any practical receiver, given a simple, unshielded method of packaging, one is always faced with the question of how to design a receiver performing under extremely high gain conditions without uncontrolled feedback. If, for a given complexity and size of components, one could identify an alternative design with less crosstalk from the output back to RF front-end input, one would implement such a design for that reason alone.

(5) Frequently the ultrasound pulser-receiver is required to be used in an imaging system that operates at several different ultrasound frequencies, such as 3.5, 5, and 7.5 MHz. Up until now, either broadband receivers had been used, or receivers with simple switched fixed-frequency filters have been used. A tissue-tracking receiver, operating in several ranges, of very simple design, would be highly desirable.

SUMMARY OF THE INVENTION

The ultrasound transceiver of the present invention provides a variable frequency, fixed-bandwidth reception of the signals reflected from tissue interfaces within the subject, providing improved rejection of multiple surface reflections, combined with improved signal resolution at the extreme penetration depth. The present invention further provides recovery of signals over a greater dynamic range than previously known.

Moreover, the present invention describes an ultrasound tranceiver having a detected signal, which inherently deconvolves the interaction of the transmitted pulse signal from the transducer impulse response and the tissue reflection response, providing an enhanced axial signal resolution.

The apparatus according to the present invention is embodied in hardware which provides these features, by way of a receiver which acquires and converts the receiver signals to a higher intermediate frequency having a constant bandwidth. The conversion to the higher frequency varies over time, such that the portion of the received spectrum changes, while maintaining the constant bandwidth requirement thus described. The particular details of the upconverted superheterodyne receiver according to the present invention provides enhanced signal processing and reduces both the false signals and economic costs for implementation. Thus the present invention provides the desired signal processing enhancements while providing a simple and cost-effective system.

BRIEF DESCRIPTION OF THE DRAWING

These and other features of the present invention can be better understood by reading the following detailed description, taken together with the drawing, wherein:

FIG. 2 is a graph showing the signal components according to the frequency upconversion process according to the present invention;

FIG. 3 is a graph demonstrating the envelope detection according to one embodiment of the present invention;

DETAILED DESCRIPTION OF THE INVENTION

The present invention includes the transceiver described by pending application Ser. No. 616,581 by the same inventor, filed June 4, 1984, herein incorporated by reference.

Figure 1:
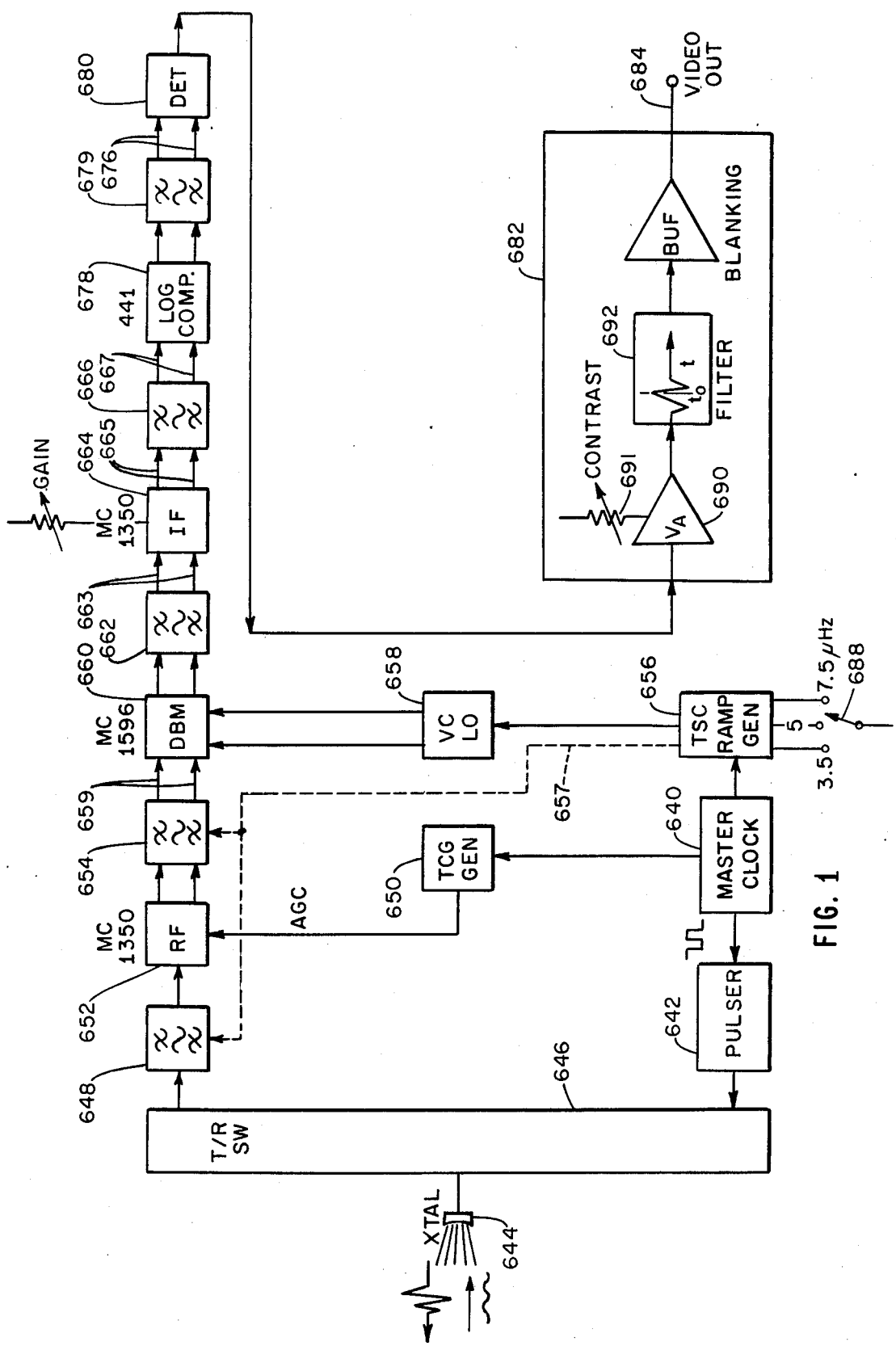
FIG. 1 is a block diagram of the upconversion asynchronous transceiver according to the present invention.

FIG. 1 shows a preferred functional design of the improvements comprising a pulser-receiver performing as summarized elsewhere. The functions of the AGI master clock 640, pulser 642, probe crystal 644, TR/ATR switch 646, bandpass filter 648, RF preamp 652, and time-controlled gain (TCG) ramp generator 650 are the same as in the design of the transceiver previously disclosed in the application Ser. No. 616,581. The TCG gain control is received by RF amplifier 652 typically a part number MC1350 by Motorola, Inc. The frequency spectrum of return echoes is only broadly confined by the broad bandpass filter 654 having a bandpass in the 2–7 MHz range. This filter acts as gross preselector whose function is mainly to prevent out-of-band (e.g. broadcast radio interference) signals from overloading amplifier 652 and causing intermodulation distortion in subsequent stages. A "tissue signature control" (TSC) ramp is generated at 656 and this signal frequency modulates a varactor-diode controlled voltage-controlled oscillator (VCO) 658 whose function in the system is to act as a local oscillator in an upconversion superheterodyne receiver. The output of VCO 658 is combined with the amplified RF echo signal at leads 659 at balanced modulator 660, typically part number MC1595 by Motorola, Inc., to produce sum-and-difference-frequency signals at point 664. A balanced modulator is used as the mixer stage because this method produces sum-and-difference components and suppresses the local oscillator in its output signal at leads 661 without the need for band-reject or notch filters. The upconverted signals at point 661 are applied to bandpass filter 662 that passes the difference frequency while rejecting the sum frequency. The output at leads 663 from this bandpass filter is fed into the "intermediate frequency" amplifier 664, also an MC1350, (a term borrowed from typical down-conversion superheterodyne receivers). The output at leads 665 is applied to an bandpass filter 666 identical to filter 662. The purpose of the second filter 666 is to steepen the dropoff rate of the skirts of the filter function of 662 so as to maximize the rejection of the sum frequencies. The output 667 is applied to log compressor 678, typically a part number 441 by Texas Instruments Corp., to video detector 680, and the output is deconvolved by circuit 682, resulting in the "analog video output" 684. The circuit 682 includes an amplifier 690 having a gain adjustment to provide contrast control. The subsequent filter 692 provides the deconvolution time function indicated within block 692 to provide image signal enhancement. The signal is buffered by amplifier 694, which also receives a blanking signal to inhibit the output video signal during the scan retrace time. It is important that filters 662 and 666 reject the sum frequency signal as improved sum frequency signal rejection greatly simplifies the problem of performing optimum envelope detection at 680 and deconvolution at 682.

The frequency upconversion process will be modelled in order to appreciate the importance of adequate sum frequency rejection, shown in FIG. 2. The descending echo specturm 700 is mixed with a descending local oscillator frequency 702 in the neighborhood of 17 MHz to produce a constant "intermediate frequency" spectrum 704 at the difference frequency of 14 MHz. The sum frequency spectrum 706, occurring at 19–21 MHz should be rejected from the IF amplification process. Otherwise a heterodyne in the neighborhood of 6 MHz will appear in the detector output.

Figure 4:
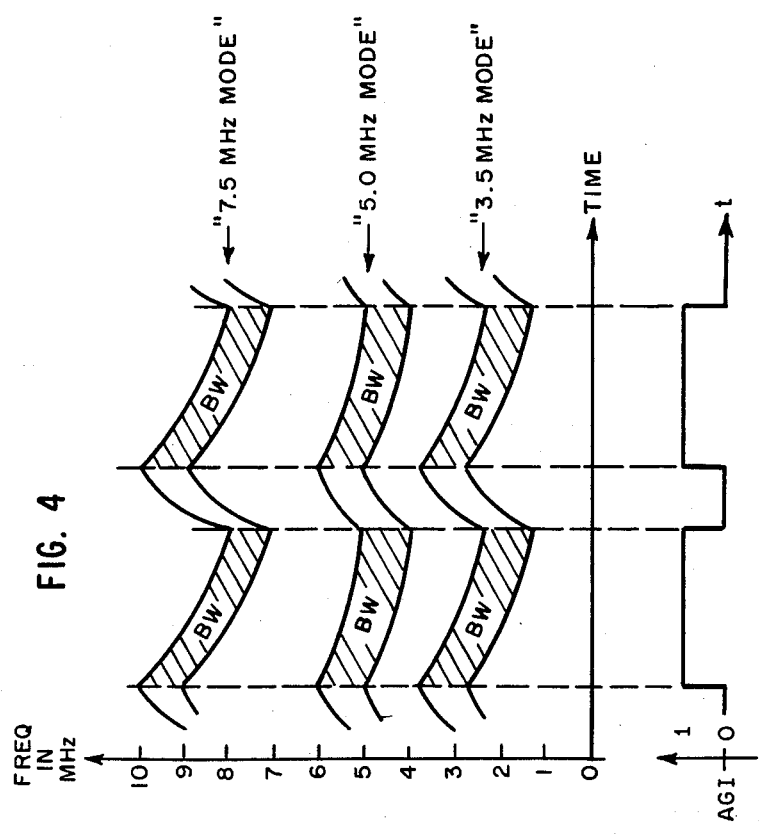
FIG. 4 is a graph showing three modes of transducer operation.

FIG. 3 clarifies these events. A typical single incoming RF echo signal 720 will have a 3-MHz carrier frequency and a duration of 1 microsecond. The video, or picture envelope information (pixel detail) is indicated by 722. The upconverted equivalent of 720, filtered to pass only the difference frequency is indicated as 724. The significance of the waveform 724 is that it contains a perfect reconstruction of the original envelope 722 and a high frequency carrier 726 of 14 MHz. Such a waveform, passing through a simple detector, can easily produce a nearly perfect video representation of the original envelope (728). If the sum frequency component enters the IF amplifier, the resulting waveform 730 produces a 6-MHz heterodyne 732, which leads to a "dirty" detector 734 comprising 6 MHz ripple content. The detector output 728 or 734 must be free of ripple content, at either 6 or 17 MHz, because the post-processing deconvolution has the effect of preemphasizing high-frequency ripple components in the detector output. However, there is less space and cost involved in improving the IF bandpass curve to steepen the skirts than to employ high-order lowpass filters within the detector stage. Also, by using more bandpass filtering at the IF level, there is better rejection of residual local oscillator signal. This is important because presence of the local oscillator at point 676 (of FIG. 1) can pre-bias the demodulator 680 (of FIG. 1), thereby artificially masking signal detection in the 30 dB range because of the continuously present oscillator feedthrough. The difference signal is used rather than the sum signal because the oscillator residuals are higher in frequency than the IF frequency, hence the oscillator feedthrough is more easily suppressed. An upconversion receiver is used (rather than the customary downconversion type) because true envelope reconstruction with a very high ripple frequency (2×14 MHz) is produced in a very direct way, and the filtering is much more economical because fewer filters are necessary and because the inductances at the IF frequency are smaller. Tuning is not critical because the entire receiver design is inherently broadbanded (approximately equal to 10 percent relative bandwidth). The employment of a superheterodyne receiver of this type has the advantage that signals are shifted far away from the incoming RF spectrum early in the processing: the feedback problem is minimal compared to a straight baseband RF (or TRF) receiver or even compared to a conventional downconversion superheterodyne. Moreover, the upconversion receiver can be adapted to operate in several distinct frequency ranges (3.5, 5, 7.5 MHz of FIG. 4) by introducing a switchable DC bias into the TSC ramp waveform. This can be accomplished by the use of an operator switch 688 that acts on generator 656 (of FIG. 1).

Figure 5:
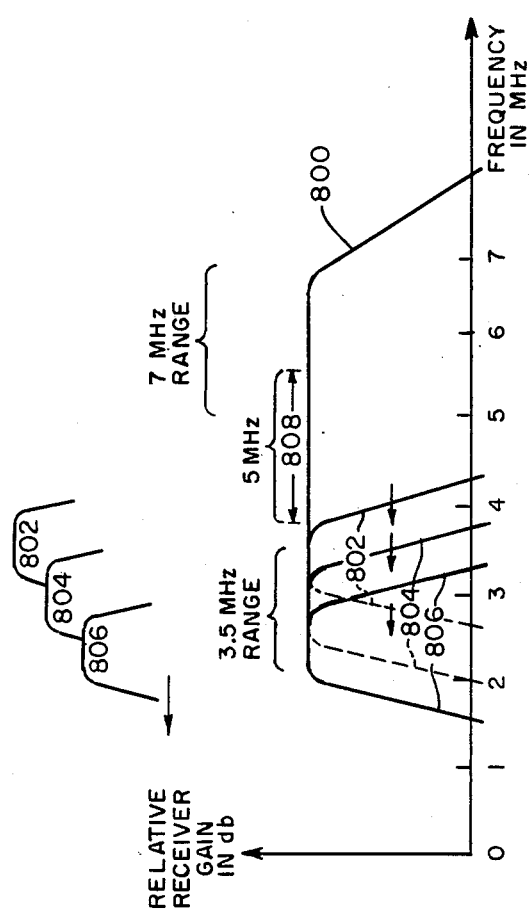
FIG. 5 is a graph showing the differing filter passbands according to the frequency ranges used according to one embodiment of the present invention.

In the event that a frequency range switch 688 is not used, the entire receiver will function with a single choice of ultrasound transducer frequency spectra, and the broad bandpass filters 648 or 654 can have its passband reduced only to cover the more limited range to minimize IM distortion. The choices available for the broad passband filters 648 or 654 are summarized in FIG. 5.

The frequency response 800 for the broad bandpass filters 648 or 654 for the general case (receiver switchable among three frequency ranges) is wide enough to admit every frequency capable of being tissue signature-processed. For example, if the receiver were to function for a 3.5 MHz crystal, the passbands 802, 804, 806 would be active through the entire receiver. When the receiver is switched to the 5-MHz mode, a similar set of moving passbands becomes active in region 808. Obviously the total frequency response 800 of filters 648 or 654 need be only as broad as the selectable passbands employed through the manner of programming the local oscillator. It should be noted that programming the local oscillator 658 is a much more economical way of moving the passband frequency spectra of a receiver than dynamically tuning highpass and lowpass filter sections.

In the field of diagnostic medical ultrasound, this oscillator tuning after the preselector filter is generally permissible only because the ratio of stopband to passband amplitudes is lower than the "strong adjacent carrier" problem in commercial (short wave) communications systems, plagued with substantial signal fading problems.

The main source of "strong adjacent carrier" signal in ultrasound is the low-frequency component (1.6–2.3 MHz) present along with the high-frequency information spectra (3.5–4.8 MHz) of interest when imaging near echoes. Since even this strong low-frequency component rarely exceeds the amplitude of the high-frequency components, there is generally no significant problem in allowing all frequencies to slip through the preselector (648, 652, 654 of FIG. 1) and to feed the balanced modulator.

When considering ultrasound receiver designs with extremely wide dynamic range (approximately 60 dB at any given depth, approximately 85–105 dB over the entire echo-train range), the absolutely perfect suppression of intermodulation distortion arising from low-frequency components entering the modulator may become important. In order to achieve this higher merit of receiver performance, one might consider designing an upconversion receiver of FIG. 1 that includes a "tracking preselector" (replacing 648, 652 of FIG. 1) with tunable RF circuitry being controlled by a signal on leads 657 from the ramp generator 656. By combining a narrow passband tunable preselector with the full upconversion feature, one would in essence obtain the maximum possible dynamic range (reducing IM distortion and noise) for a given bandwidth (rise time merit).

These and other embodiments of the present invention are within the scope of the present invention. Further embodiments, and substitutions by one skilled in the art are clearly within the present invention, which is not to be limited, except by the claims which follow.

What is claimed is:

1. For use with an ultrasound transducer, a selected bandwidth ultrasound transceiver comprising:
   means for generating an ultrasound signal having a selected amplitude and frequency;
   means for energizing said transducer for signal propagation of said ultrasound signal through a medium, wherein said transducer provides a reflected signal upon receipt of a reflection of said propagated signal; and
   means for receiving said reflected signal, comprising:
      superheterodyne receiver means for continuously selecting different frequency components from among the signal frequency components of said reflected signal according to the depth of the received reflected signal, providing an output signal by modulating the local oscillator frequency according to said selected different signal frequency components, wherein
      said detector means output signal describes the reflective characteristics within said medium, the amplitude variations and relative time intervals providing indication of medium reflectivity at corresponding medium depths.

2. The selected bandwidth ultrasound tranceiver of claim 1, wherein
   said signal frequency components of said reflected signal corresponding to the transmitted signal are selectively rejected.

3. The selected bandwidth ultrasound tranceiver of claim 1, wherein
   said superheterodyne receiver means comprises an upconverting receiver having an intermediate frequency higher than said reflected signal, said intermediate frequency being determined by an intermediate frequency filter selected to form a selected bandpass.

4. The selected bandwidth ultrasound transceiver of claim 1, wherein
   said IF filter has a constant bandwidth.

5. The selected bandwidth ultrasound tranceiver of claim 1, wherein
   said superheterodyne receiver means receives decreasing range of frequencies with respect to time, corresponding to the received reflected signals resulting from increasingly deeper reflections within said medium.

6. The ultrasound transceiver of claim 5, wherein
   the generated ultrasound signal having selected amplitude and frequency is selected to produce a detected filter output signal having a deconvolution impulse response characteristic.

7. The ultrasound transceiver of claim 6, further including
   means for displaying an image according to said detected filter output signal.

8. A receiver for accurately reconstructing the envelope of a received ultrasound signal, including:
   means for providing a local oscillator signal;
   means for selectively increasing the frequency of the received ultrasound signal to provide a first converted signal comprising an upconverted signal, wherein said means for selectively increasing further provides at least one of a second converted signal having a frequency different from said upconverted signal, said local oscillator signal and said received ultrasound signal;
   means for rejecting the signals provided by said means for selectively increasing except said first converted signal; and
   means for detecting the first converted signal to provide an accurately reconstructed envelope of said received ultrasound signal.

9. The receiver of claim 8, wherein:
   said received ultrasound signal comprises a repetitive signal having a period, said receiver further comprising frequency control means providing a control signal having a period corresponding to the period of received ultrasound signal, wherein said means for providing a local oscillator signal varies said local oscillator signal repetitively according to said frequency control signal.

10. The receiver of claim 9, further comprising a tracking preselector for selectively amplifying said received ultrasound signal before being received by said means for selectively increasing the frequency of the received ultrasound signal, wherein said tracking preselector provides said selective amplification according to said frequency control signal.

11. The receiver of claim 8, wherein the frequency of said local oscillator signal is greater than said first converted signal.

12. The receiver of claim 8, wherein said means for rejecting includes an intermediate frequency circuit.

13. The receiver of claim 12, wherein said intermediate frequency circuit has a constant bandwidth.

14. A method of accurately reconstructing the envelope of a received ultrasound signal, comprising the steps of:

generating a local oscillator signal;

increasing the frequency of the received ultrasound signal to provide a first converted signal comprising an upconverted signal, wherein at least one of a second converted signal having a frequency different from said first converted signal, said local oscillator signal, and said received ultrasound signal is also produced;

rejecting each signal produced in the step of increasing the frequency of the received ultrasound signal except the first converted signal; and amplitude detecting said upconverted signal wherein said envelope is accurately recovered.

* * * * *